(12) United States Patent
Crawford et al.

(10) Patent No.: US 10,763,829 B2
(45) Date of Patent: Sep. 1, 2020

(54) COUNTER CIRCUITRY AND METHOD

(71) Applicant: ARM LIMITED, Cambridge (GB)

(72) Inventors: Ashley John Crawford, Ashdon (GB); John Michael Horley, Hauxton (GB)

(73) Assignee: ARM LIMITED, Cambridge (GB)

( * ) Notice: Subject to any disclaimer, the term of this patent is extended or adjusted under 35 U.S.C. 154(b) by 0 days.

(21) Appl. No.: 15/683,962

(22) Filed: Aug. 23, 2017

(65) Prior Publication Data
US 2019/0068172 A1 Feb. 28, 2019

(51) Int. Cl.
| | |
|---|---|
| *H03J 7/06* | (2006.01) |
| *H03K 21/40* | (2006.01) |
| *G07C 3/04* | (2006.01) |
| *G06F 1/3203* | (2019.01) |
| *H03B 5/12* | (2006.01) |
| *H03K 9/06* | (2006.01) |

(52) U.S. Cl.
CPC ............ *H03J 7/065* (2013.01); *G06F 1/3203* (2013.01); *G07C 3/04* (2013.01); *H03B 5/12* (2013.01); *H03K 9/06* (2013.01); *H03K 21/406* (2013.01)

(58) Field of Classification Search
CPC . H03J 7/06; G06F 1/3203; G07C 3/04; H03K 21/406
See application file for complete search history.

(56) References Cited

U.S. PATENT DOCUMENTS

| | | | |
|---|---|---|---|
| 6,222,900 B1* | 4/2001 | Hara | H03K 21/00 377/107 |
| 2008/0178024 A1* | 7/2008 | Kamegawa | G06F 1/3203 713/322 |

* cited by examiner

*Primary Examiner* — Lincoln D Donovan
*Assistant Examiner* — Colleen J O Toole
(74) *Attorney, Agent, or Firm* — Nixon & Vanderhye PC

(57) ABSTRACT

Apparatus comprises master counter circuitry to generate a master count signal in response to a clock signal; slave counter circuitry responsive to the clock signal to generate a respective slave count signal; and a synchronisation connection providing signal communication between the master counter circuitry and the slave counter circuitry; the master counter circuitry being configured to provide to the slave counter circuitry via the synchronisation connection: (i) data indicative of a count offset value and (ii) a timing signal defining a timing relationship between the clock signal and the count offset value; and the slave counter circuitry being configured, during a synchronisation operation for that slave counter circuitry, to initialise a counting operation of that slave counter circuitry in response to the data indicative of the count offset value and a timing signal provided by the master counter circuitry.

18 Claims, 6 Drawing Sheets

US 10,763,829 B2

COUNTER CIRCUITRY AND METHOD

BACKGROUND

This disclosure relates to counter circuitry and methods.

Some data processing apparatuses have a central 'always-on' source of time, known as the system counter that monotonically increases. This continuous count source is distributed to all processing elements in the system in such a way that the observation of this source is consistent and does not, through communication between processors, lead to time appearing to move backwards.

Some techniques for distributing this signal involve using distributed counters. Each distributed counter must be accurately synchronized to the current, continuously incrementing, always-on system counter offset when it is powered-on and before any processor observes it.

A consequence of distributing the counters is that they may be power-cycled quite frequently and therefore the synchronization potentially needs also to occur frequently.

SUMMARY

In an example arrangement there is provided apparatus comprising:

master counter circuitry to generate a master count signal in response to a clock signal;

slave counter circuitry responsive to the clock signal to generate a respective slave count signal; and a synchronisation connection providing signal communication between the master counter circuitry and the slave counter circuitry;

the master counter circuitry being configured to provide to the slave counter circuitry via the synchronisation connection: (i) data indicative of a count offset value and (ii) a timing signal defining a timing relationship between the clock signal and the count offset value; and the slave counter circuitry being configured, during a synchronisation operation for that slave counter circuitry, to initialise a counting operation of that slave counter circuitry in response to the data indicative of the count offset value and a timing signal provided by the master counter circuitry.

In another example arrangement there is provided an integrated circuit comprising apparatus as defined above.

In another example arrangement there is provided apparatus comprising:

master counter means for generating a master count signal in response to a clock signal;

slave counter means for generating a slave count signal in response to the clock signal; and a synchronisation connection means for providing signal communication between the master counter means and the slave counter means;

the master counter means being operable to provide to the slave counter means via the synchronisation connection means: (i) data indicative of a count offset value and (ii) a timing signal defining a timing relationship between the clock signal and the count offset value; and the slave counter means being operable, during a synchronisation operation for that slave counter means, to initialise a counting operation of that slave counter means in response to the data indicative of the count offset value and a timing signal provided by the master counter means.

In another example arrangement there is provided a method comprising:

master counter circuitry generating a master count signal in response to a clock signal;

the master counter circuitry providing to slave counter circuitry via a synchronisation connection: data indicative of a count offset value and a timing signal defining a timing relationship between the clock signal and the count offset value;

the slave counter circuitry, during a synchronisation operation for that slave counter circuitry, initialising a counting operation of that slave counter circuitry in response to the data indicative of the count offset value and the timing signal provided by the master counter circuitry; and the slave counter circuitry generating a slave count signal in response to the clock signal.

Further respective aspects and features of the present technology are defined by the appended claims.

BRIEF DESCRIPTION OF THE DRAWINGS

The present technique will be described further, by way of example only, with reference to embodiments thereof as illustrated in the accompanying drawings, in which.

DESCRIPTION OF EMBODIMENTS

Figure 1:
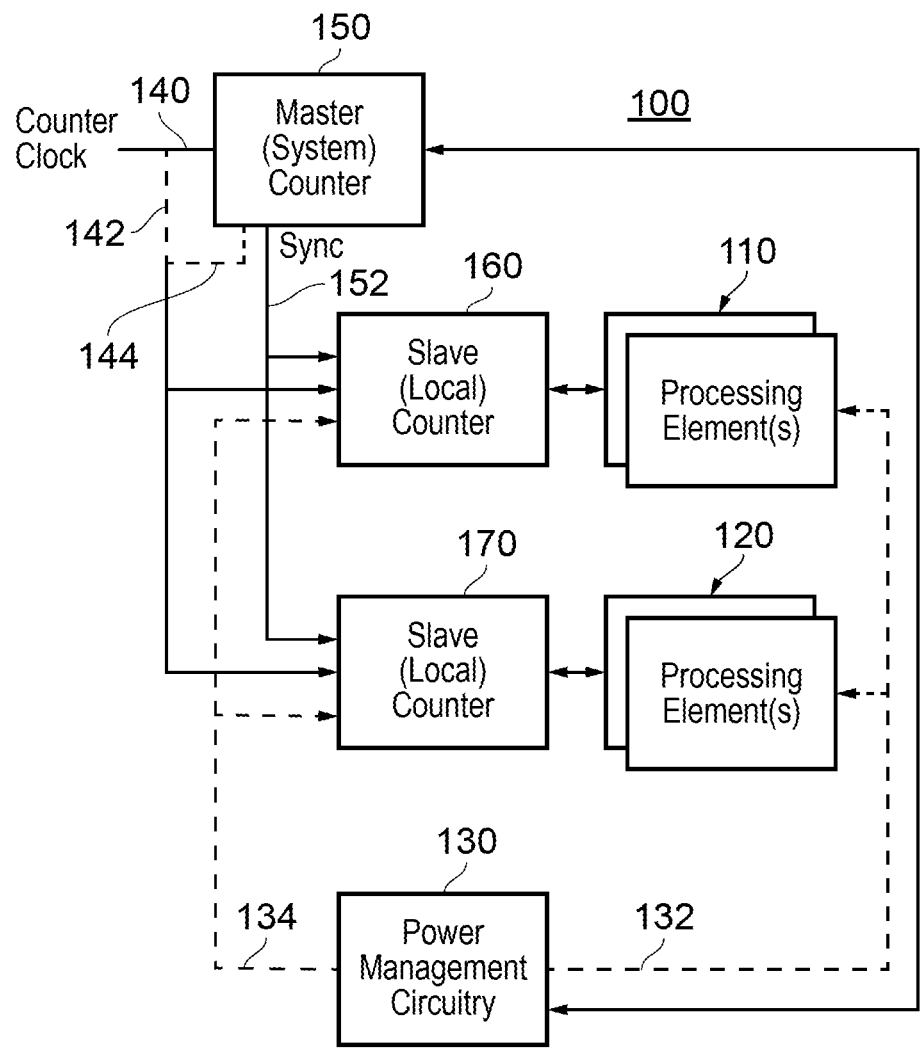
FIG. 1 schematically illustrates apparatus embodied as an integrated circuit.

Before discussing the embodiments with reference to the accompanying figures, the following description of embodiments is provided.

An example embodiment provides apparatus comprising: master counter circuitry to generate a master count signal in response to a clock signal; slave counter circuitry responsive to the clock signal to generate a respective slave count signal; and a synchronisation connection providing signal communication between the master counter circuitry and the slave counter circuitry; the master counter circuitry being configured to provide to the slave counter circuitry via the synchronisation connection: (i) data indicative of a count offset value and (ii) a timing signal defining a timing relationship between the clock signal and the count offset value; and the slave counter circuitry being configured, during a synchronisation operation for that slave counter circuitry, to initialise a counting operation of that slave counter circuitry in response to the data indicative of the count offset value and a timing signal provided by the master counter circuitry.

Example embodiments provide a synchronisation technique which can be hardware-based and atomic in operation, with a bounded latency because it depends on communication which may be directly from the master counter to the slave counter rather than (in previously proposed examples) writing data to memory mapped registers or the like. The example embodiments can be simple to implement from a system programmer's point of view.

In example arrangements, the synchronisation connection provides serial communication of the data indicative of a count offset value and the timing signal. For example, the synchronisation connection may comprise a single conductive path from the master counter circuitry to the slave counter circuitry. In this way, the synchronisation information can be provided by a single, potentially atomic, hardware communication path.

The count offset value can indicate a future count, such that the slave counter can be synchronised to the future count in response to the timing signal In such examples, the count offset value indicates a count value applicable at a time that the timing signal is provided to the slave counter circuitry. For convenience of the synchronisation process, in some examples the master counter circuitry is configured to provide the data indicative of a count offset value before providing the timing signal. However, in other examples, the count offset value does not have to indicate a particular future value, just a value having a known relationship with the time indicated by the timing signal.

To ensure that there is sufficient time available to transmit the future count before synchronisation takes place, in examples the master counter circuitry comprises an offset generator configured to generate the count offset value in response to: a current state of the master count signal; and a time period to transmit the count offset value via the synchronisation connection. The time period could be predetermined and stored so as to be accessible by the master counter, or could be derived in response to the information that is to be transmitted. A margin could be added to such a time period.

Example embodiments provide power management circuitry to control transitions of the slave counter circuitry between an operational state and a quiescent state. For example, the apparatus may be configured to initiate a synchronisation operation for a slave counter circuitry in response to a transition of that slave counter circuitry from the quiescent to the operational state. In this way a newly powered-up slave counter circuitry can be initialised to a counting operation aligned with the master counter.

In some examples, the apparatus comprises one or more processing elements configured to perform processing operations in response to the slave count signal, the power management circuitry being configured to control transitions of the one or more processing elements between an operational state and a quiescent state. The power management circuitry may be configured to control a transition of the one or more processing elements from the quiescent state to an operational state in response to completion of the synchronisation operation for the slave counter circuitry. To allow a newly powered-up processing element to be able to access a valid count from a slave counter, in example arrangements the power management circuitry is configured to indicate to the master counter circuitry that a synchronisation operation should be started, in response to initiation of a transition of the slave counter circuitry from the quiescent state to the operational state. In order to be able to power-up the relevant processing element promptly, in example arrangements the master counter circuitry is configured to indicate to the power management circuitry that a synchronisation operation has completed; and the power management circuitry is configured to initiate a transition of the one or more processing elements from the quiescent to the operational state in response to the master counter circuitry indicating that a synchronisation operation has completed. In other examples, however, the master counter could perform synchronisation operations at intervals, so avoiding the need for communication from the power management circuitry to the master counter circuitry to initiate a synchronisation process.

An elegantly convenient way of communicating between the master counter circuitry and the power management circuitry is one in which the master counter circuitry comprises a register configured to store a data item indicative of whether a synchronisation operation should be started; the power management circuitry is configured to write data to the register to indicate that a synchronisation operation should be started; and the master counter circuitry is configured to store a data item in the register to indicate that a synchronisation operation has completed. However, in other examples, communication techniques such as interrupts could be used, for example to indicate completion of a synchronisation operation. Or the power management circuitry could itself observe (detect) the issue of at least the timing signal on the synchronisation connection. Or it could wait a predetermined time after initiation of the synchronisation operation (and assume it has been completed).

In some examples, the slave counter circuitry is configure to count according to count increments defined by a scaling value; and the master counter circuitry is configured to provide the scaling value to the slave counter circuitry via the synchronisation connection, during a synchronisation operation for that slave counter circuitry. This allows for the counting operation to proceed at a different rate to that of the clock signal, and for the slave counter to be initialised to operate at that different rate. However, in other examples, the scaling value could be sent only once and then latched in non-volatile memory at the slave counter, or it could be hard-wired at the slave counter.

To allow for control of the supply of the clock signal, in some examples the master counter circuitry is configured to supply the clock signal to the slave counter circuitry.

The techniques are applicable to apparatus comprising two or more slave counter circuitries, separately controllable by the power management circuitry between the quiescent state and the operational state.

The apparatus may be embodied as an integrated circuit such as (for example) a system-on-chip (SoC) or a network-on-chip (NoC) arrangement.

Another example embodiment provides apparatus comprising:

master counter means for generating a master count signal in response to a clock signal;

slave counter means for generating a slave count signal in response to the clock signal; and a synchronisation connection means for providing signal communication between the master counter means and the slave counter means;

the master counter means being operable to provide to the slave counter means via the synchronisation connection means: (i) data indicative of a count offset value and (ii) a timing signal defining a timing relationship between the clock signal and the count offset value; and the slave counter means being operable, during a synchronisation operation for that slave counter means, to initialise a counting operation of that slave counter means in response to the data indicative of the count offset value and a timing signal provided by the master counter means.

Another example embodiment provides a method comprising:

master counter circuitry generating a master count signal in response to a clock signal;

the master counter circuitry providing to slave counter circuitry via a synchronisation connection: data indicative of a count offset value and a timing signal defining a timing relationship between the clock signal and the count offset value;

the slave counter circuitry, during a synchronisation operation for that slave counter circuitry, initialising a counting operation of that slave counter circuitry in response to the data indicative of the count offset value and the timing signal provided by the master counter circuitry; and the slave counter circuitry generating a slave count signal in response to the clock signal.

Referring now to the drawings, FIG. 1 schematically illustrates an apparatus 100 embodied as an integrated circuit, for example a so-called system-on-chip (SoC) or network-on-chip (NoC). Those features of the apparatus 100 relevant to the present discussion are illustrated; other features or circuitry may also be provided and are not shown in FIG. 1.

The apparatus comprises multiple processing elements (PEs) 110, 120 to carry out data processing operations. As part of their functionality, they can be powered-up or down (which is to say, transitioned between a quiescent state and an operational state), under the control of power management circuitry 130 using control signals 132 to control a supply of power to the processing elements 110, 120. Another aspect of their operation is to access a count value based upon counter circuitry counting cycles of a counter clock 140. The way in which the count values are made available to the processing elements 110, 120 will be discussed in detail below.

A master (system) counter 150 provides a central "always-on" source of a time count signal, for example using a 64 bit counter (noting that counting to $2^{64}$ represents a long period of running of even a high frequency clock). This master counter operates to count cycles of the counter clock 140 in such a way that the count value which it generates always monotonically increases. This continuous count value needs to be distributed to all processing elements in the apparatus in such a way that the observation (by any processing element) of the count value is consistent and can never (through communication of data dependent upon the count values between processing elements, or otherwise), lead to a situation in which time according to the count values appears to move backwards.

To avoid having to provide large (wide) on-chip buses for the count values, each operating at high speed, one or more slave (local) counters 160, 170 are provided. This arrangement means that the slave or local counters 160, 170 are synchronised to the counting operation carried out at the master (system) counter 150, that are provided locally to the processing elements 110, 120 so that long, wide, high speed count value buses are not required. Therefore, the count generated by the master counter circuitry does not itself need to be distributed, but it is maintained and used for the distribution of synchronisation information to allow the local counter(s) to be synchronised to the count of the master counter.

The slave (local) counters 160, 170 are also capable of being transitioned between a quiescent and an operational state, again under the control of a control signal 134 from the power management circuitry 130.

As part of its operation, the master counter 150 provides a signal to synchronise operation of the slave counters 160, 170. This can be provided by a single serial connection 152 referred to as "Sync". The connection Sync 152 can provide an example of a synchronisation connection provides serial communication of the data indicative of a count offset value and the timing signal. For example, the synchronisation connection can comprise a single conductive path (a single "wire" or conductive path on or in the integrated circuit) from the master counter circuitry to the slave counter circuitry.

The slave counters are also responsive to the counter clock 140. As illustrated by the alternative paths represented by broken lines 142, 144, the counter clock 140 can be provided directly to the slave counters 160, 170 or can be provided via the master counter 150. Reasons for these alternatives will be discussed below.

The power management circuitry 130 provides power management of the various elements in the apparatus 100. Elements which are controlled between the operational and quiescent states together, which is to say they transition collectively as a group, can be referred to as representing a "power island". So, the processing elements 110 may be individually controllable from a power management point of view, or could operate together in a power island. In FIG. 1 as drawn, there are 4 power islands: the slave counter 160, the slave counter 170, the processing elements 110 and the processing elements 120, so providing an example in which two or more slave counter circuitries are separately controllable by the power management circuitry between the quiescent state and the operational state. In other arrangements, the slave counters 160, 170 could form a single power island, for example.

Therefore the power management circuitry 130 can provide an example of power management circuitry to control transitions of the slave counter circuitry between an operational state and a quiescent state. The processing elements 110, 120 can provide an example of one or more processing elements configured to perform processing operations in response to the slave count signal, the power management circuitry 130 being configured to control transitions of the one or more processing elements between an operational state and a quiescent state.

Note that although two slave counters and two groups of processing elements are shown in FIG. 1, there could in fact be just one slave counter or there could be multiple slave counters, and the number of processing elements is variable according to the system design and the capacity (in terms of space, for example) on the integrated circuit.

The issue of power management is relevant to the use of local or slave counters, in that the system should be arranged to allow a processing element, when transitioned from a quiescent to an operational state, to access a valid count value straight away. Also, a slave counter, when transitioned from a quiescent to a operational state, needs to be synchronised so that its count operation is time-aligned (count-aligned) with the count operation of the master counter 150. Techniques to achieve these arrangements will be discussed below.

FIG. 1 therefore provides an example of apparatus comprising:

master counter circuitry 150 to generate a master count signal in response to a clock signal; slave counter circuitry 160, 170 responsive to the clock signal to generate a respective slave count signal; and a synchronisation connection 152 providing signal communication between the master counter circuitry and the slave counter circuitry. As discussed in more detail below, the master counter circuitry is configured, to provide to the slave counter circuitry via the synchronisation connection: (i) data ("offset") indicative of a count offset value and (ii) a timing signal (a sync pulse) defining a timing relationship between the clock signal and the count offset value; and the slave counter circuitry is configured, during a synchronisation operation for that slave counter circuitry, to initialise a counting operation of that slave counter circuitry in response to the data indicative of the count offset value and the timing signal provided by the master counter circuitry.

Figure 2:
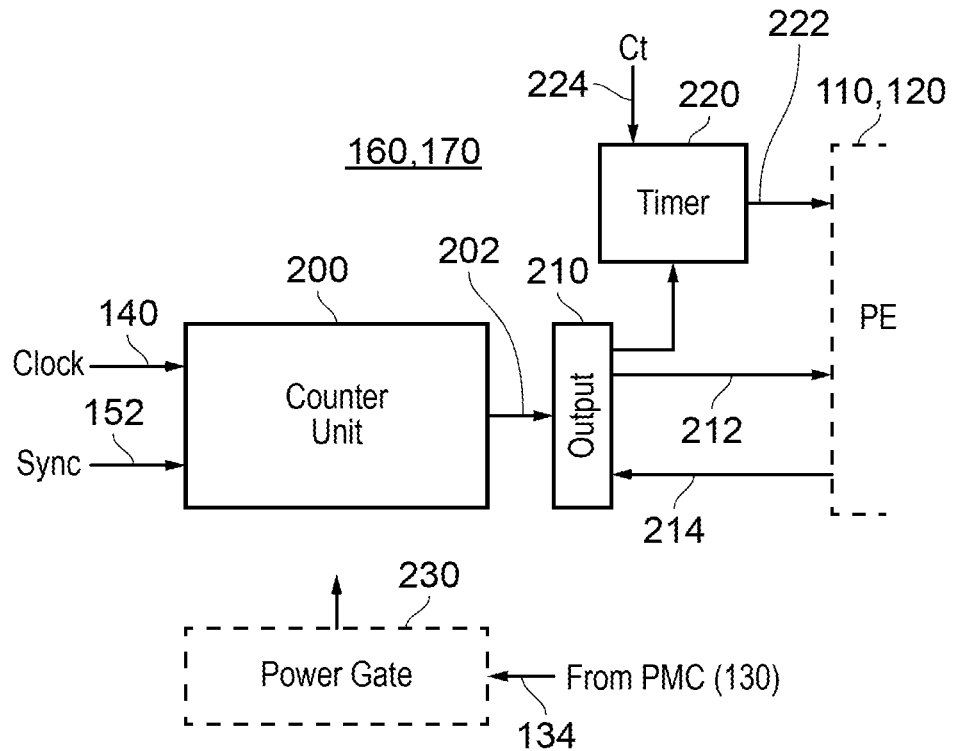
FIG. 2 schematically illustrates slave counter circuitry.

FIG. 2 schematically illustrates an example of slave counter circuitry, for example providing the function of the slave counter 160 or the slave counter 170 of FIG. 1.

The slave counter circuitry of FIG. 2 comprises a counter unit 200, an output latch 210 and a timer 220. The slave counter circuitry operates under the control of a power gate 230 according to the control signal 134 from the power management circuitry 130. The power gate 230 may form part of the slave counter circuitry or may be an external power management component providing power to the slave counter circuitry.

Figure 3:
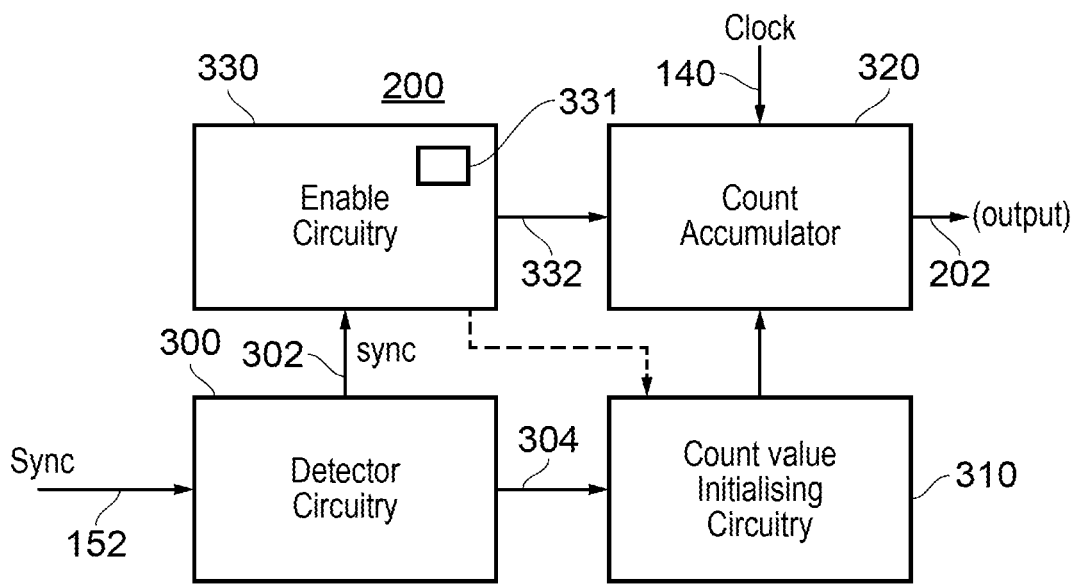
FIG. 3 schematically illustrates a counter unit.

The counter unit 200, shown in more detail in FIG. 3, is responsive to the counter clock signal 140 and the Sync signal 152 to generate (when in the operational mode) a count output 202 which is latched by the output latch 210 and provided, as an output 212 in response to a query 214, to the processing element 110, 120. The timer 220 is also responsive to the count output to generate one or more interrupt signals 222 to interrupt operations of the processing elements according to a comparison between one or more threshold count values 224 and a current counter output 202 as provided by the output latch 210.

Referring to FIG. 3, which shows the counter units 200 in more detail, the Sync signal 152 is provided to detector circuitry 300 which extracts, from the serial information provided by the Sync signal, a synchronisation pulse 302 and data 304 such as scale_val and offset. The meaning of the signals 302, 304 will be discussed below.

In response to the scale_val and offset data, count value initialising circuitry 310 initialises a count state of a count accumulator 320. In response to the synchronisation pulse 302, enable circuitry 330 provides a control signal 332 to enable operation of the count accumulator to count cycles of the clock signal 140 starting from the initialised values set by the count value initialising circuitry 310.

Figure 4:
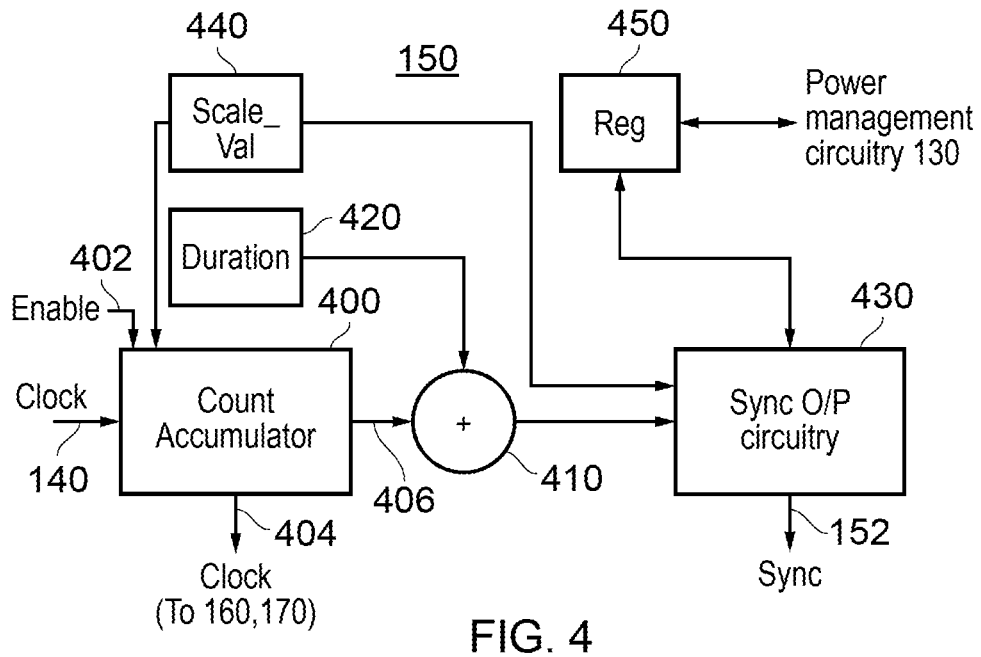
FIGS. 4 and 5 schematically illustrate examples of master counter circuitry.
Figure 5:
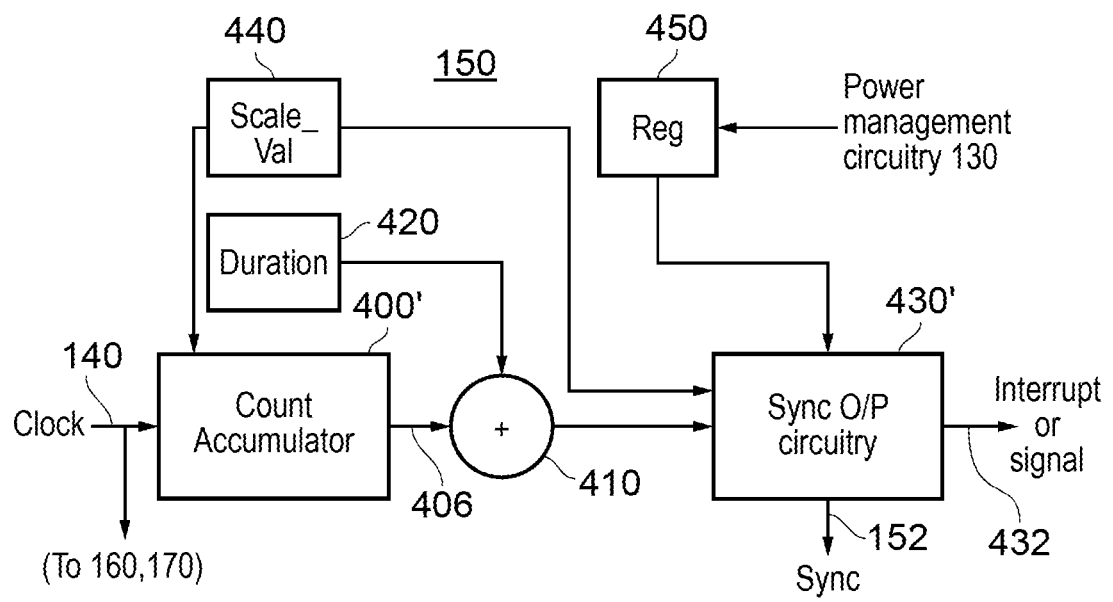

FIGS. 4 and 5 schematically illustrate examples of master counter circuitry 150. The two examples are similar in many respects, and matters which are common between FIGS. 4 and 5 will not be described twice.

Referring to FIG. 4, the master counter circuitry 150 comprises a count accumulator 400 responsive to the counter clock signal 140 and operating under the control of an enable signal 402. When enabled, the count accumulator passes the clock signal 140 as an output 404 to the slave counters 160, 170. When not enabled by the enabled signal 402, the count accumulator does not forward the clock signal as the output 404. This allows counting to be paused, for example for debugging purposes, such that if counting is paused at the master counter, it is also paused at the slave counters because the clock signal is not provided to the slave counters when the master counter's count accumulator 400 is not enabled. This arrangement corresponds to the broken line path 144 in FIG. 1, in which the master counter circuitry is configured to supply the clock signal to the slave counter circuitry.

The accumulated count output by the count accumulator 406 is provided to an adder circuit 410. The adder circuit 410 adds a current value of the accumulated count 406 to a "duration" value held by a register 420. This can be a predetermined duration value or can be calculated based on parameters of a current data communication (such as the length of a serial transmission required to transmit current synchronisation data). The purpose of the duration value is that it represents a time period (optionally, plus a margin), which will be taken to transmit data such as the offset and scale_val data using the serial communication line Sync to a slave counter.

Adding a duration value to the current accumulated count value gives a "future" count value which can be established at the slave counter and then, in response to a synchronisation pulse from the master counter, the operation of the slave counter can be started with effect from that future count value. So, by setting the future count value to be a current count value plus a duration value, the master counter can ensure that there is time to transmit the associated data (including data defining the future value) to the slave counter before issuing the synchronisation pulse to start counting at that value. In this way, the count offset value can indicate a count value applicable at a time that the timing signal is provided to the slave counter circuitry. This provides an example in which the adder circuit 410 acts as an offset generator configured to generate the count offset value in response to: a current state of the master count signal; and a time period to transmit the count offset value via the synchronisation connection.

The sum of the current count value 406 and the duration value from the register 420 is provided to sync output circuitry 430.

The sync output circuitry 430 is also responsive to a value scale_val held by a register 440. The purpose of scale_val will be discussed below.

Scale_val is optionally provided to allow for the use of so-called "scaled time". This term represents an arrangement in which respective parts of the system of FIG. 1 can operate with respect to a counter clock speed which is not necessarily the same as the actual rate of the counter clock 140. Indeed, the operating speed may not be a simple power-of-two sub-multiple of the counter clock 140. A ratio, scale_val, is used. Scale_val can be, for example, a fixed point value having integer and fractional parts. A counter (the master counter or a slave counter) can count in units of scale_val, although the count values output by that counter represent only integer parts of the count values (the fractional parts are used within the respective counter but are not exported as count values). This operation can be conducted at the master counter and separately (using the same scale_val for example) at the slave counter. Different slave counters can use respective different values of scale_val if required.

In the present arrangements, in order to intialise a slave counter, the slave counter is time-aligned or count-aligned with the master counter. But if scaled time is in use, the slave counter also needs to be initialised with an appropriate scale_val value. If scale_val is required in a particular arrangement, it is supplied as part of the synchronisation process using the techniques described here. This therefore provides an example in which the slave counter circuitry is configure to count according to count increments defined by a scaling value; and the master counter circuitry is configured to provide the scaling value to the slave counter circuitry via the synchronisation connection, during a synchronisation operation for that slave counter circuitry.

The sync output circuitry 430 operates under the control of a control register 450. This can be a single-bit register, although in other examples it could store further information such as the identity of a particular slave counter to be synchronised.

In the example of FIG. 4, the register 450 can be written to and read by the power management circuitry 130. In a technique to be described below, the power management circuitry sets the register 450 to a particular state, such as writing a "1" to the register 450, in order to cause a synchronisation operation to take place. At the end of the synchronisation operation, which is to say, when the sync output circuitry 430 has issued a synchronisation pulse, the sync output circuitry 430 resets the register 450 to its original state which is detected by the power management circuitry 130 and made use of according to a technique to be described below.

The format of signals output by the sync output circuitry will be discussed below with reference to example timing diagrams of FIGS. 8 to 11. In general terms, the sync output circuitry 430 outputs, on the Sync connection 152, at least data indicative of the offset value and a synchronisation pulse (which forms an example of a timing signal defining a timing relationship between the clock signal and the offset value). The sync output circuitry 430 can also output other information such as scale_val value and/or an identification indicator.

Referring to FIG. 5, as mentioned above, much of the circuitry is in common with FIG. 4. The differences will be discussed here.

In the example of FIG. 5, the broken line path 142 of FIG. 1 is used for the clock signal, so the clock signal 140 is not routed to the slave counters via the count accumulator 400, but instead is routed directly to them. This means that the clock signal 140 is not gated by the count accumulator 400 under the control of the enabled signal 402. Note that an enable signal could be provided to the count accumulator 400', but is not shown in FIG. 5 since its use is not relevant to the particular operations being described.

Another difference is that the power management circuitry 130 can write to the register 450 to initiate operation of the sync output circuitry 430', but in order to indicate completion of a synchronisation operation, the sync output circuitry 430' instead generates an interrupt or other signal 432 which can be recognised and responded to by the power management circuitry 130.

Figure 6:
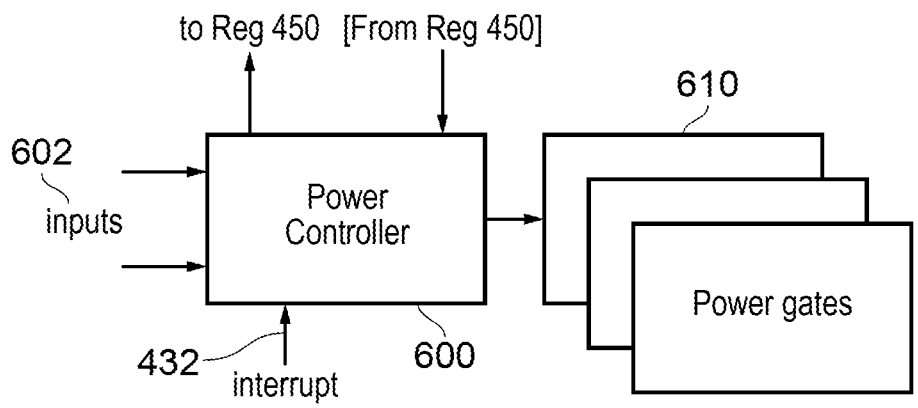
FIG. 6 schematically illustrates power management circuitry.

FIG. 6 schematically illustrates power management circuitry comprising a power controller 600 and one or more power gates 610 of the type shown as the power gate 230 in FIG. 2. As mentioned above, the power gates may be considered as part of the power management circuitry or else part of the power-controlled circuitry. Each power gate controls the supply of electrical power to a so-called power island.

The power controller 600 is responsive to one or more inputs 602 such as control signals from a supervisory process running on the apparatus 100, environmental signals indicating ambient conditions such as temperature, signals indicating a current loading of one or more of the processing elements, and the like.

The power controller 600 can write to the register 450 of FIGS. 4, 5 and, in the case of FIG. 4, can read from the register 450. In the case of FIG. 5, the power controller is responsive to the interrupt signal 432. In either case, these are examples in which the master counter circuitry is configured to indicate (by the register 450 or the interrupt or other signal 432) to the power management circuitry that a synchronisation operation has completed; and the power management circuitry is configured to initiate a transition of the one or more processing elements from the quiescent to the operational state in response to the master counter circuitry indicating that a synchronisation operation has completed.

Figure 7:
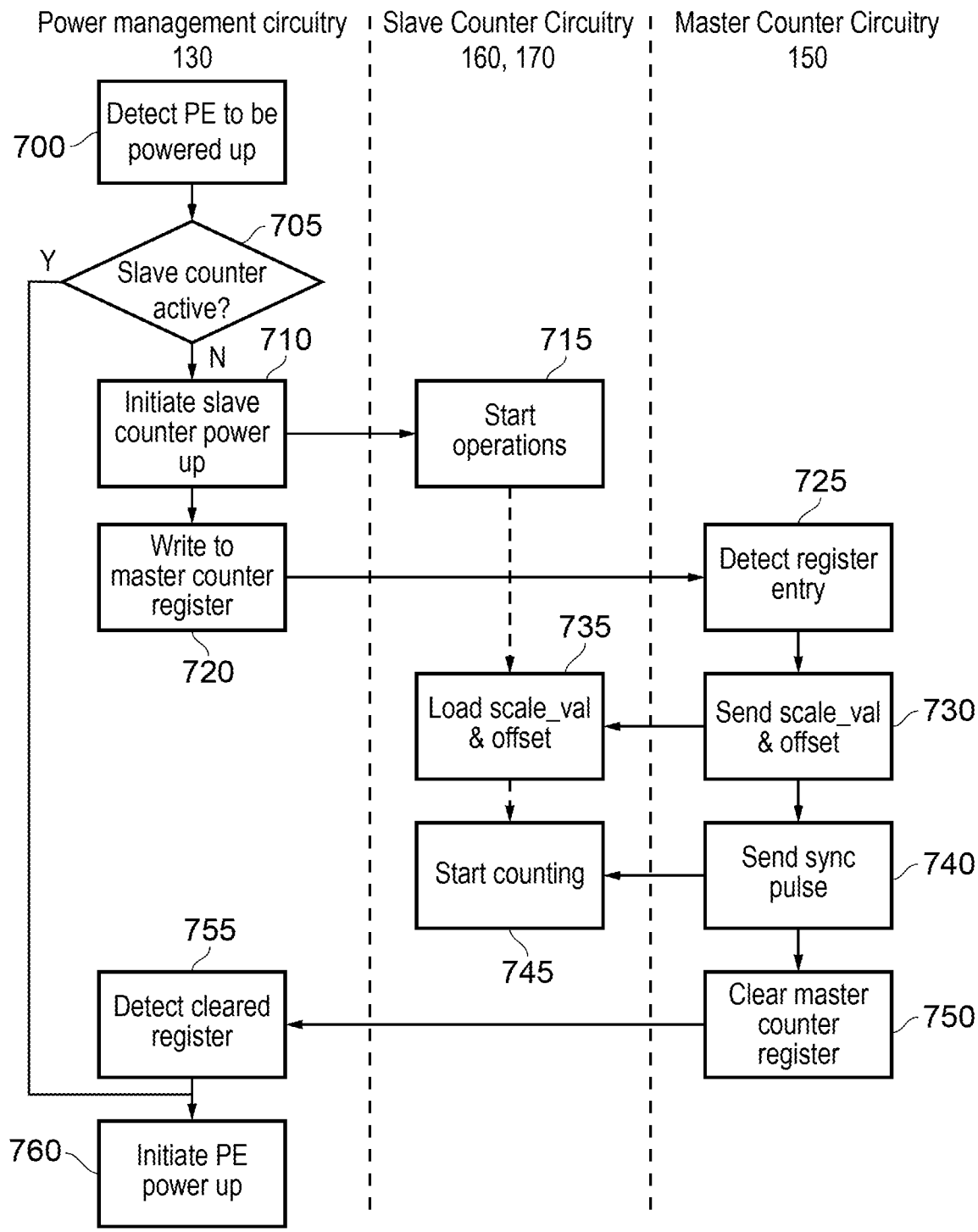
FIG. 7 is a schematic flowchart illustrating a method.

FIG. 7 is a schematic flow chart illustrating example operations of the power management circuitry 130, the slave counter circuitry 160, 170 and the master counter circuitry 150, represented by operations drawn in respective columns of FIG. 7 separated by broken lines.

At a step 700, the power management circuitry detects (for example, in response to one or more inputs 602) that a processing element which is currently in the quiescent state should be powered-up into the operational state. At a step 705, the power management circuitry 130 detects whether the corresponding slave counter is currently in the operational state. Here, the corresponding slave counter is that particular slave counter (or in other examples multiple particular slave counters) which that processing element will access in order to obtain a current count value. If the answer is yes at the step 705 then control passes to a step 760 at which a process is initiated to power-up that processing element and the flow of control ends—at least as regards this portion of the operation of the power management circuitry.

However, if at the step 705, the slave counter corresponding to the processing element is not currently in the operational state, then a process is started to power-up the slave counter and establish synchronisation between its local count and the master (system) count of the master counter 150, all of which is carried out before the step 760 can be undertaken. This is to ensure that as soon as the processing element is powered-up, it has access to a currently valid slave or local count value.

So, at the "no" output of the step 705, control passes to a step 710 at which the power management circuitry initiates (by the signal 134) the powering up of the appropriate slave counter. The slave counter circuitry starts operations at a step 715.

The power management circuitry is configured to indicate to the master counter circuitry that a synchronisation operation should be started, in response to initiation of a transition of the slave counter circuitry from the quiescent state to the operational state. In particular, at a step 720, the power management circuitry writes a value to the master counter register 450 to initiate a synchronisation operation by the master counter. The master counter circuitry 150 detects this register entry at a step 725. This provides an example in which the master counter circuitry comprises a register 450 configured to store a data item indicative of whether a synchronisation operation should be started; and the power management circuitry 130 is configured to write data to the register (720) to indicate that a synchronisation operation should be started.

The steps 710, 715, 720, 725 provide an example of the apparatus being configured to initiate a synchronisation operation for a slave counter circuitry in response to a transition of that slave counter circuitry from the quiescent to the operational state.

At a step 730, the master counter circuitry 150 sends, using the serial connection Sync 152, the scale_val and offset values, for example, and these are loaded to the count accumulator 320 by the count value initialising circuitry 310 of the slave counter circuitry at a step 735.

Then, at a step 740, the master counter circuitry sends a synchronisation pulse, in response to which the enable circuitry 330 of the slave counter causes the count accumulator 320 of the slave counter circuitry to start counting at a step 745.

The master counter circuitry then clears (at a step 750) the master counter register 450, for example by writing a "zero" value (or, in the example of FIG. 5, issues an interrupt or other signal 432) to indicate to the power management circuitry 130 that the synchronisation operation is complete. The power management circuitry 130 detects the cleared register (or the interrupt or other signal) at a step 755 and passes control to the step 760 where, as discussed above, a process is initiated to power-up the relevant processing element. This arrangement provides an example in which the master counter circuitry is configured to store (750) a data item (such as a zero value) in the register to indicate that a synchronisation operation has completed; and the power management circuitry is configured to initiate (760) a transition of the one or more processing elements from the quiescent to the operational state in response to the master counter circuitry storing the data item in the register (as detected at 755) to indicate that a synchronisation operation has completed. In other examples, however, the power management circuitry could detect at least the sync pulse on the Sync connection 152; or it could simply wait a predetermined time after initiation of the synchronisation operation.

The indirect route to the step 760 (via the "no" outcome of the step 705) represents an example in which the power management circuitry is configured to control a transition of the one or more processing elements from the quiescent state to an operational state in response to completion of the synchronisation operation for the slave counter circuitry.

FIGS. 8 to 11 are schematic timing diagrams illustrating signals serially provided or transmitted by the serial connection 152 of FIG. 1, which is to the Sync connection between the master counter and slave counters.

The representations of FIGS. 8 to 11 are drawn with respect to time, from an earlier time (to the left of the diagrams as drawn) to a later time (to the right of the diagrams as drawn).

Figure 8:
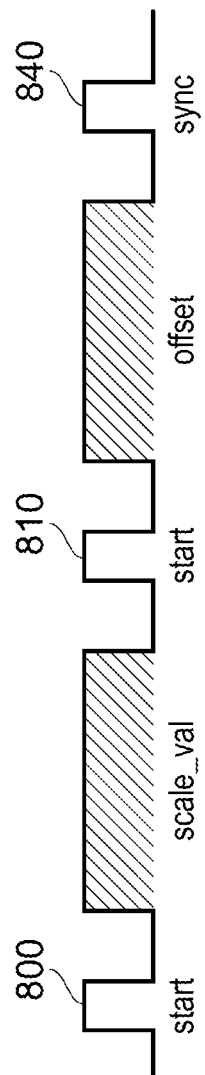
FIGS. 8 to 11 are schematic timing diagrams.

In FIG. 8, the synchronisation process starts with the transmission, by the sync output circuitry 430, of a start signal 800. This could be a signal pulse or "1" value on the Sync connection 152, or could in other examples be a unique code indicative of a start of a transmission. Here, the term "unique" implies that such a code is not used for other purposes (or does not occur) during the whole of the rest of a synchronisation transmission, so that, with respect to any other data being sent on the connection 152, the start indication 800 can be identified. This arrangement can address the case of a local counter being powered-on during an on-going synchronisation operation, such that (in the absence of the use of a unique code) the local counter could potentially misinterpret a later part of the synchronisation sequence as the initial 'start'. By using the unique code, this is avoided. It could also be addressed in other ways. For example, since the register 450 in the master counter is implemented to clear only on completion of the process, and is monitored by the power management circuitry, the power management circuitry can be arranged to not initiate new slave counter power-on sequences during an ongoing synchronization sequence. As the synchronization sequence is likely to last perhaps 200 cycles, this is considered to be an acceptable constraint. In other examples, the issue could be ignored on the basis that the time spent on synchronisation sequences is a very tiny proportion and so the chance of such a clash is limited.

Then, the sync output circuitry 430, 430' transmits, in either order, the scale_val value and the offset value, optionally separated by a distinguishing pulse or code 810. The time taken to transmit these data items, a time period 820, is used in the derivation of the duration value stored by the register 420. For example, the duration value may be equal to the time period 820 plus a margin 830. Finally, a synchronisation pulse 840 is transmitted, at which time the slave counter starts counting from the count value established by the offset value sent as part of the transmission.

Figure 9:
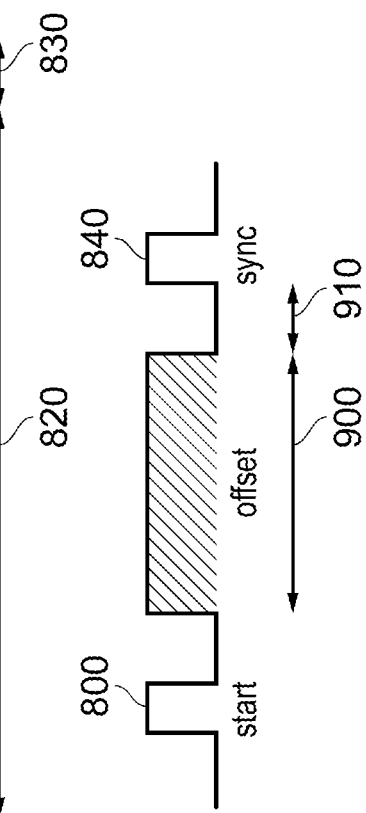

FIG. 9 schematically illustrates a simplified version in which just the offset value is transmitted, corresponding to a system which does not make use of scale_val values. Here, the duration stored in the register 420 may be formed of the period 900 plus a margin 910.

Figure 10:
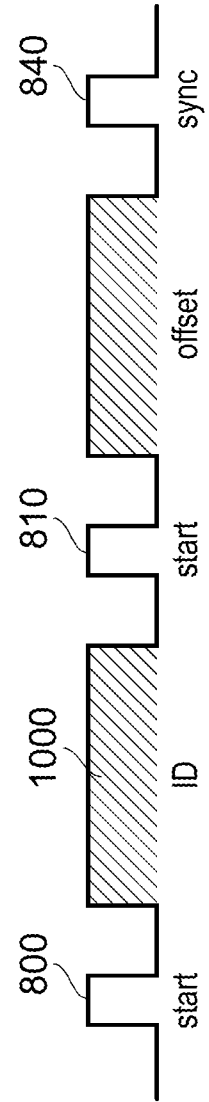

In a further alternative in FIG. 10, the power management circuitry 130 writes an identification value into the register 450 to initiate synchronisation. The sync output circuitry provides that identification value (ID) 1000 as part of the synchronisation package of data transmitted via the Sync connection 152. At the slave counters, an individual slave counter would detect whether the synchronisation data carried the identification of that slave counter before conducting an initialisation based on that synchronisation package.

Figure 11:
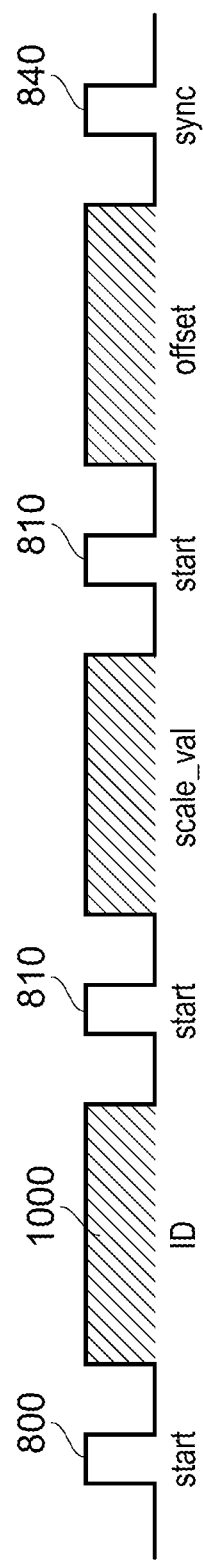

In FIG. 11, the synchronisation data comprises the ID value 1000, the scale_val value and the offset value, each of which may be separated by separating or start pulses 810.

In the example of FIGS. 8-11, in accordance with the examples of the steps 730, 740 of FIG. 7, the master counter circuitry is configured to provide the data indicative of a count offset value before providing the timing signal.

Figure 12:
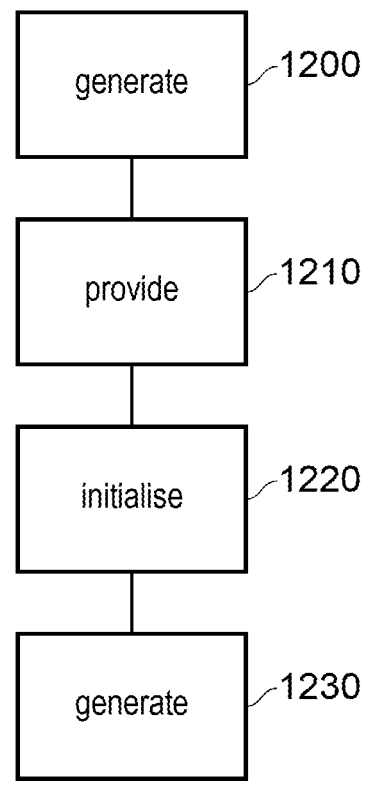
FIG. 12 is a schematic flowchart illustrating a method.

Finally, FIG. 12 is a schematic flowchart illustrating a summary method comprising:

master counter circuitry generating (at a step 1200) a master count signal in response to a clock signal;

the master counter circuitry providing (at a step 1210) to slave counter circuitry via a synchronisation connection: data indicative of a count offset value and a timing signal defining a timing relationship between the clock signal and the count offset value;

the slave counter circuitry, during a synchronisation operation for that slave counter circuitry, initialising (at a step 1220) a counting operation of that slave counter circuitry in response to the data indicative of the count offset value and the timing signal provided by the master counter circuitry; and the slave counter circuitry generating (at a step 1230) a slave count signal in response to the clock signal.

In the present application, the words "configured to . . . " are used to mean that an element of an apparatus has a configuration able to carry out the defined operation. In this context, a "configuration" means an arrangement or manner of interconnection of hardware or software. For example, the apparatus may have dedicated hardware which provides the defined operation, or a processor or other processing device (such as a processing element as discussed above) may be programmed to perform the function. "Configured to" does not imply that the apparatus element needs to be changed in any way in order to provide the defined operation.

Although illustrative embodiments of the present techniques have been described in detail herein with reference to the accompanying drawings, it is to be understood that the present techniques are not limited to those precise embodiments, and that various changes, additions and modifications can be effected therein by one skilled in the art without departing from the scope and spirit of the techniques as defined by the appended claims. For example, various combinations of the features of the dependent claims could be made with the features of the independent claims without departing from the scope of the present techniques.

We claim:

1. Apparatus comprising:
   master counter circuitry to generate a master count signal in response to a clock signal;
   slave counter circuitry responsive to the clock signal to generate a respective slave count signal; and
   a synchronisation connection providing signal communication between the master counter circuitry and the slave counter circuitry;

the master counter circuitry being configured to provide to the slave counter circuitry via the synchronisation connection: (i) data indicative of a count offset value and (ii) a timing signal defining a timing relationship between the clock signal and the count offset value, wherein the master counter circuitry is configured to provide the data indicative of the count offset value before providing the timing signal, wherein the data indicative of the count offset value indicates a future count value applicable at a time that the timing signal is provided to the slave counter circuitry; and the slave counter circuitry being configured, during a synchronisation operation for that slave counter circuitry, to initialise a counting operation of that slave counter circuitry in response to the data indicative of the count offset value and the timing signal provided by the master counter circuitry.

2. Apparatus according to claim 1, in which the synchronisation connection provides serial communication of the data indicative of a count offset value and the timing signal.

3. Apparatus according to claim 2, in which the synchronisation connection comprises a single conductive path from the master counter circuitry to the slave counter circuitry.

4. Apparatus according to claim 1, in which the master counter circuitry comprises an offset generator configured to generate the count offset value in response to:
a current state of the master count signal; and
a time period to transmit the count offset value via the synchronisation connection.

5. Apparatus according to claim 1, comprising:
power management circuitry to control transitions of the slave counter circuitry between an operational state and a quiescent state.

6. Apparatus according to claim 5, the apparatus being configured to initiate a synchronisation operation for a slave counter circuitry in response to a transition of that slave counter circuitry from the quiescent to the operational state.

7. Apparatus according to claim 6, comprising one or more processing elements configured to perform processing operations in response to the slave count signal, the power management circuitry being configured to control transitions of the one or more processing elements between an operational state and a quiescent state.

8. Apparatus according to claim 7, in which the power management circuitry is configured to control a transition of the one or more processing elements from the quiescent state to an operational state in response to completion of the synchronisation operation for the slave counter circuitry.

9. Apparatus according to claim 8, in which the power management circuitry is configured to indicate to the master counter circuitry that a synchronisation operation should be started, in response to initiation of a transition of the slave counter circuitry from the quiescent state to the operational state.

10. Apparatus according to claim 8, in which:
the master counter circuitry is configured to indicate to the power management circuitry that a synchronisation operation has completed; and
the power management circuitry is configured to initiate a transition of the one or more processing elements from the quiescent to the operational state in response to the master counter circuitry indicating that a synchronisation operation has completed.

11. Apparatus according to claim 10, in which:
the master counter circuitry comprises a register configured to store a data item indicative of whether a synchronisation operation should be started;

the power management circuitry is configured to write data to the register to indicate that a synchronisation operation should be started; and
the master counter circuitry is configured to store a data item in the register to indicate that a synchronisation operation has completed.

12. Apparatus according to claim 1, in which:
the slave counter circuitry is configure to count according to count increments defined by a scaling value; and
the master counter circuitry is configured to provide the scaling value to the slave counter circuitry via the synchronisation connection, during a synchronisation operation for that slave counter circuitry.

13. Apparatus according to claim 1, in which the master counter circuitry is configured to supply the clock signal to the slave counter circuitry.

14. Apparatus according to claim 5, comprising two or more slave counter circuitries, separately controllable by the power management circuitry between the quiescent state and the operational state.

15. An integrated circuit comprising apparatus according to claim 1.

16. Apparatus comprising:
means for generating a master count signal in response to a clock signal;
means for generating a slave count signal in response to the clock signal; and
means for providing signal communication between the means for generating a master count signal and the means for generating a slave count signal;
the means for generating a master count signal being operable to provide to the means for generating a slave count signal via the means for providing signal communication: (i) data indicative of a count offset value and (ii) a timing signal defining a timing relationship between the clock signal and the count offset value, wherein the means for generating a master count signal is configured to provide the data indicative of the count offset value before providing the timing signal, wherein the data indicative of the count offset value indicates a future count value applicable at a time that the timing signal is provided to the slave counter circuitry; and
the means for generating a slave count signal being operable, during a synchronisation operation for that means for generating a slave count signal, to initialise a counting operation of that means for generating a slave count signal in response to the data indicative of the count offset value and the timing signal provided by the means for generating a master count signal.

17. A method comprising:
master counter circuitry generating a master count signal in response to a clock signal;
the master counter circuitry providing to slave counter circuitry via a synchronisation connection: data indicative of a count offset value and a timing signal defining a timing relationship between the clock signal and the count offset value, wherein the master counter circuitry provides the data indicative of the count offset value before providing the timing signal wherein the data indicative of the count offset value indicates a future count value applicable at a time that the timing signal is provided to the slave counter circuitry;
the slave counter circuitry, during a synchronisation operation for that slave counter circuitry, initialising a counting operation of that slave counter circuitry in response to the data indicative of the count offset value and the timing signal provided by the master counter circuitry; and the slave counter circuitry generating a slave count signal in response to the clock signal.

18. Apparatus according to claim 1, wherein the data indicative of a count offset value and the timing signal defining a timing relationship between the clock signal and the count offset value are separated by a pulse or a code.

* * * * *